(12) United States Patent
Ru

(10) Patent No.: US 6,903,456 B2
(45) Date of Patent: Jun. 7, 2005

(54) PACKAGE CARRIER HAVING MULTIPLE INDIVIDUAL CERAMIC SUBSTRATES

(75) Inventor: Shao-Pin Ru, Taipei (TW)

(73) Assignee: Tong Hsing Electric Industries, Ltd., Taipei (TW)

( * ) Notice: Subject to any disclaimer, the term of this patent is extended or adjusted under 35 U.S.C. 154(b) by 68 days.

(21) Appl. No.: 10/680,893

(22) Filed: Oct. 8, 2003

(65) Prior Publication Data

US 2005/0077611 A1 Apr. 14, 2005

(51) Int. Cl.$^7$ .............................................. H01L 21/44
(52) U.S. Cl. ........................ 257/701; 257/685; 257/723
(58) Field of Search ................... 257/678, 685, 257/686, 701–705, 723–725, 783, 789; 361/717–723, 679; 430/269

(56) References Cited

U.S. PATENT DOCUMENTS

| | | | | |
|---|---|---|---|---|
| 4,810,616 A | * | 3/1989 | Grabbe et al. | 430/269 |
| 6,818,473 B2 | * | 11/2004 | Kim et al. | 438/107 |
| 2003/0218236 A1 | * | 11/2003 | Wright et al. | 257/668 |

* cited by examiner

*Primary Examiner*—Nathan J. Flynn
*Assistant Examiner*—Leonardo Andujar
(74) *Attorney, Agent, or Firm*—Jackson Walker, LLP

(57) ABSTRACT

A package carrier has multiple ceramic substrates and a frame with a polymid tape. The frame has multiple through holes for receiving the ceramic substrates. The ceramic substrates are packaged with chips. The frame is made of plastic so the package carrier can be easily cut to separate individual electronic devices. The present invention combines individual ceramic substrates with the plastic frame so the cutting time can be reduced and the quantity of electronic devices fabricated is increased.

4 Claims, 6 Drawing Sheets

PACKAGE CARRIER HAVING MULTIPLE INDIVIDUAL CERAMIC SUBSTRATES

BACKGROUND OF THE INVENTION

1. Field of the Invention

The present invention relates to a package carrier having multiple individual ceramic substrates, and more particularly to a package carrier having multiple individual ceramic substrates for fast and easy packaging multiple electronic devices.

2. Description of Related Art

To operate consistently at high frequencies, most electronic devices are fabricated on ceramic substrates. Low-temperature co-fired ceramics (LTCC) ceramic substrates are often used in the fabrication of electronic devices because LTCC ceramic substrates have high temperature and large current resistance features.

The ceramic substrate is composed of multiple LTCC ceramic plates. Each LTCC ceramic plate has wire patterns. The multiple ceramic plates are stacked and then pressed together at 900° C. Ceramic substrates are used with a chip package process to fabricate electronic devices that operate at high frequencies.

To mass-produce the electronic devices, a ceramic panel is fabricated. Each ceramic panel can be divided many ceramic substrates. With reference to FIG. 5, a ceramic panel (50) has multiple ceramic substrates (51) and cutting channels (52). The cutting channels (52) are between adjacent ceramic substrates (51). However, the ceramic panel (50) is composed of mulitiple large ceramic plates (not shown) that have the following problems.

The ceramic plates can deform at high temperatures during the pressing process and further effect the electrical features of the electronic device because the ceramic plates are large and have different coefficients of expansion. Therefore, the quality of each ceramic substrate (51) on the ceramic panel (50) cannot be controlled accurately.

With further reference to FIG. 6A and 6B, the packaged ceramic panel (50) is cut along the cutting channels (shown in FIG. 5) to separate individual electronic devices (not numbered) after multiple chips (61) and encapsulant (60) are packaged on the ceramic panel (50). Cutting the ceramic panel (50) invariably damages some of the electronic devices because the ceramic panel (50) composed of multiple ceramic plates is harder than printed circuit boards or thin metal carriers mounted on the ceramic panel (50). Therefore, the quantity of electronic devices fabricated is decreased.

Using the large ceramic panel to fabricate ceramic substrates for the chips not only wastes much ceramic material when the cutting channels are cut but also requires more time for cutting to separate the individual electronic devices.

To overcome the shortcomings, the present invention provides a package carrier having multiple ceramic dies to mitigate or obviate the aforementioned problems.

SUMMARY OF THE INVENTION

The main objective of the invention is to provide a package carrier composed of multiple individual ceramic substrates and a plastic frame. Therefore, in chip package process mounts the chips on and connects the chips to the corresponding ceramic substrates and only the plastic frame is cut so ceramic material is not wasted, and cutting time is reduced.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
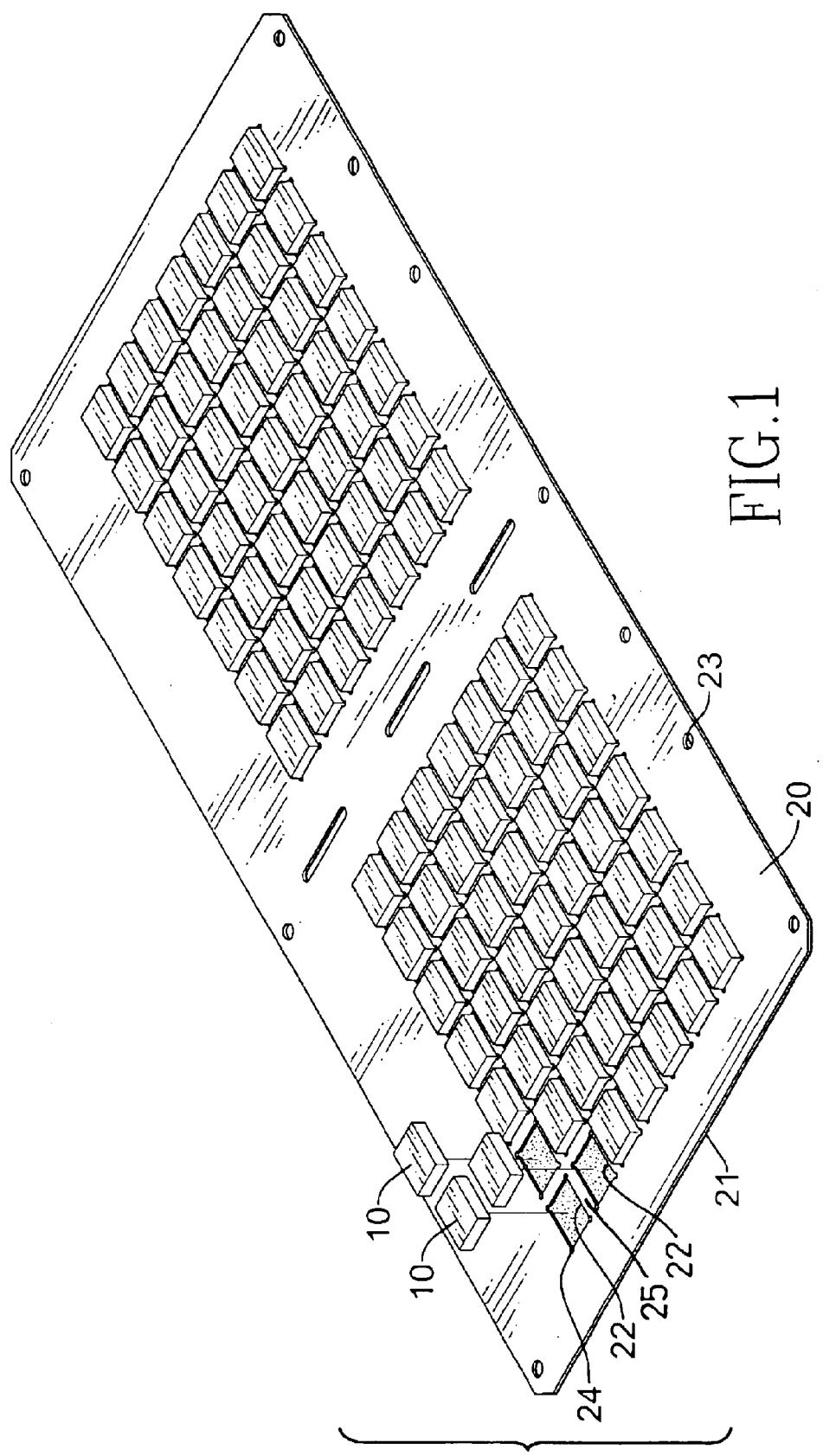
FIG. 1 is a perspective view of a package carrier having multiple ceramic dies in accordance with the present invention.
Figure 2:
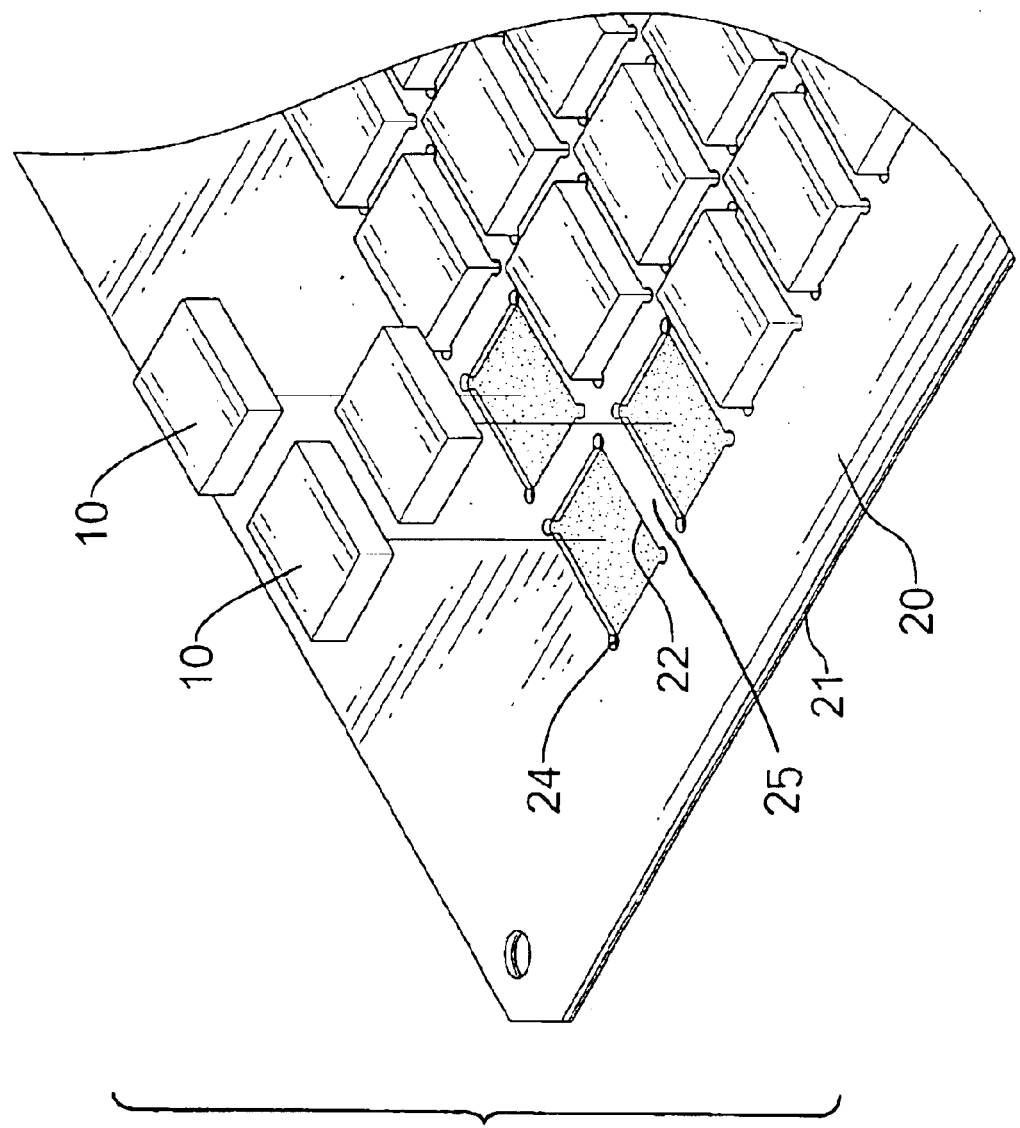
FIG. 2 is an enlarged exploded perspective view of a segment of the package carrier in FIG. 1.
Figure 3:
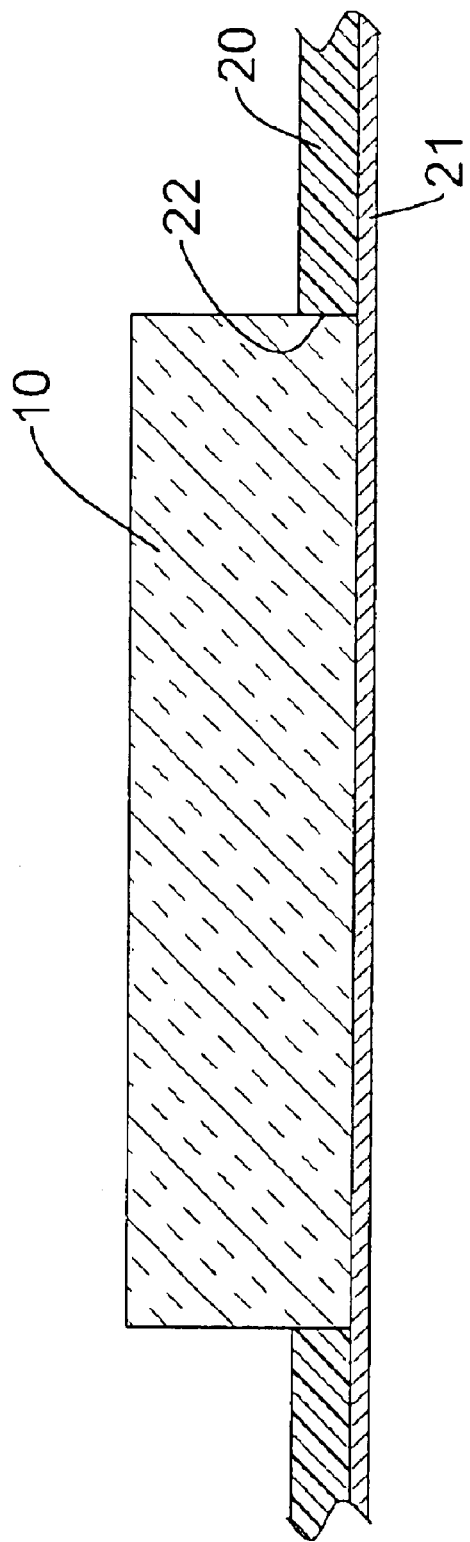
FIG. 3 is an enlarged cross sectional side plan view of a single substrate in the package carrier in FIG. 1.

With reference to FIGS. 1, 2 and 3, a package carrier (not numbered) in accordance with the present invention includes multiple individual ceramic substrates (10) and a frame (20). The frame (20) has a bottom (not numbered), two long sides (not numbered), multiple through holes (22), multiple cutting channels (25) and a polymide tape (21). The cutting channels (25) are defined respectively between adjacent through holes (22). The polymide tape (21) has a high temperature-resistance and is bonded to the bottom of the frame (20). Therefore, each through hole (22) becomes a recess to hold a ceramic substrate (10). The frame (20) is made of insulating material that is not harder than the ceramic material, such as plastic. The ceramic substrate (10) is composed of multiple small ceramic plates (not shown), and a wire pattern is formed on each small ceramic plate.

The ceramic substrates (10) and the through holes are rectangular and have four corners (not numbered), and the ceramic substrates (10) are slightly smaller than the through holes (22) so the ceramic substrates (10) easily fit in the through holes (22). To prevent a ceramic substrate (10) in a through hole (22) from abutting the corners of the through hole (22) and being damaged, a notch (24) is further defined in each corner of the through hole (22).

Further, the frame (20) has at least one reference hole (23) defined on the one or both of the two long sides. The reference hole (23) allows the frame (20) to be mounted in a specific position in automatic packaging equipment during a chip package process.

With reference to FIGS. 4A to 4D, the package carrier is used in the chip package process.

Figure 4A:
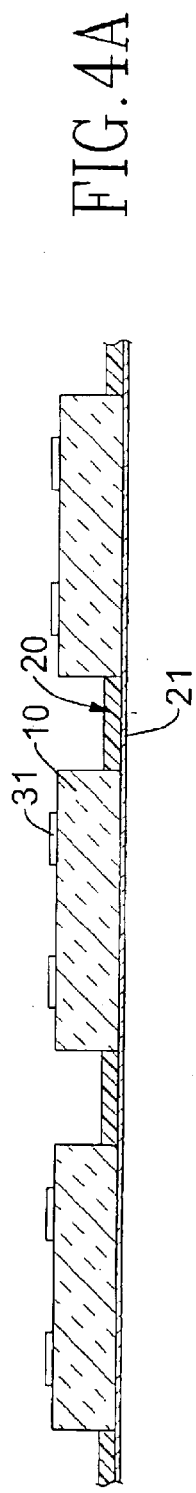
FIG. 4A is a side plan view in partial section of a segment of the package carrier in FIG. 1.

With reference to FIG. 4A, many chips (31) are respectively mounted on and connected to the ceramic substrates

Figure 4B:
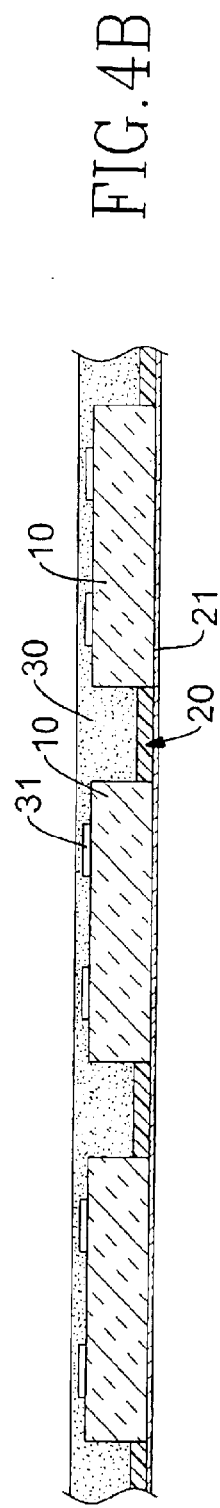
FIG. 4B is a side plan view in partial section of a segment of the package carrier in FIG. I with encapsulant.
Figure 4C:
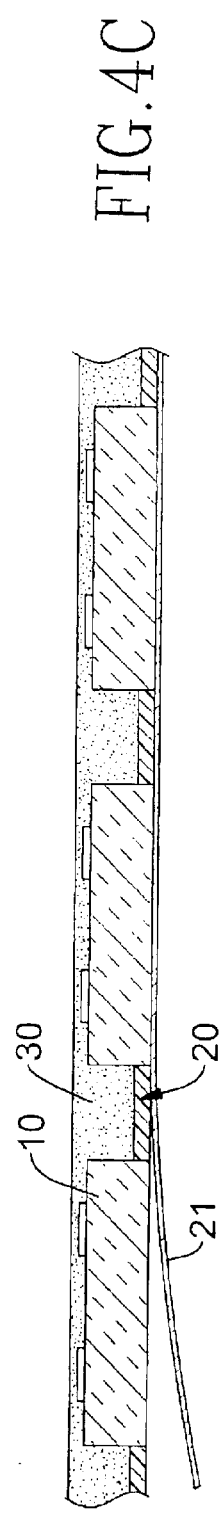
FIG. 4C is an operational side plan view in-partial section of a segment of the package carrier in FIG. 4B showing a polymide tape being removed.
Figure 4D:
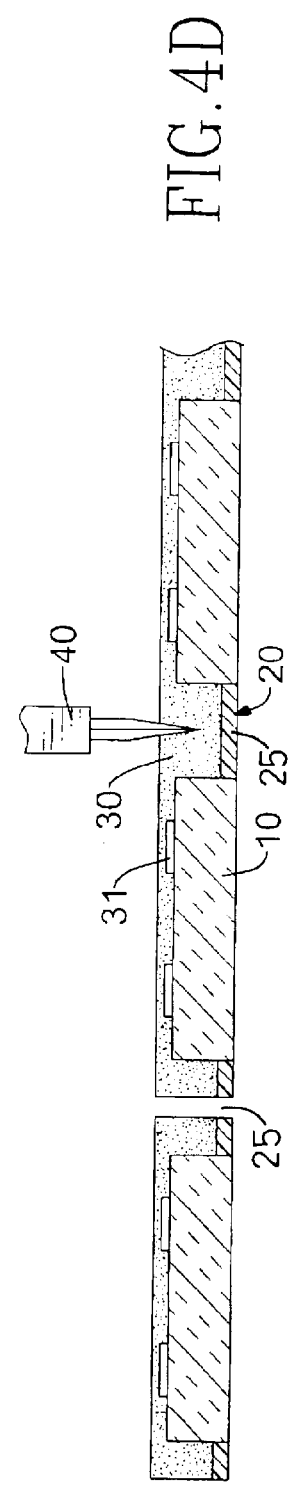
FIG. 4D is an operational side plan view in partial section of the package carrier in FIG. 4C being cut.
Figure 5:
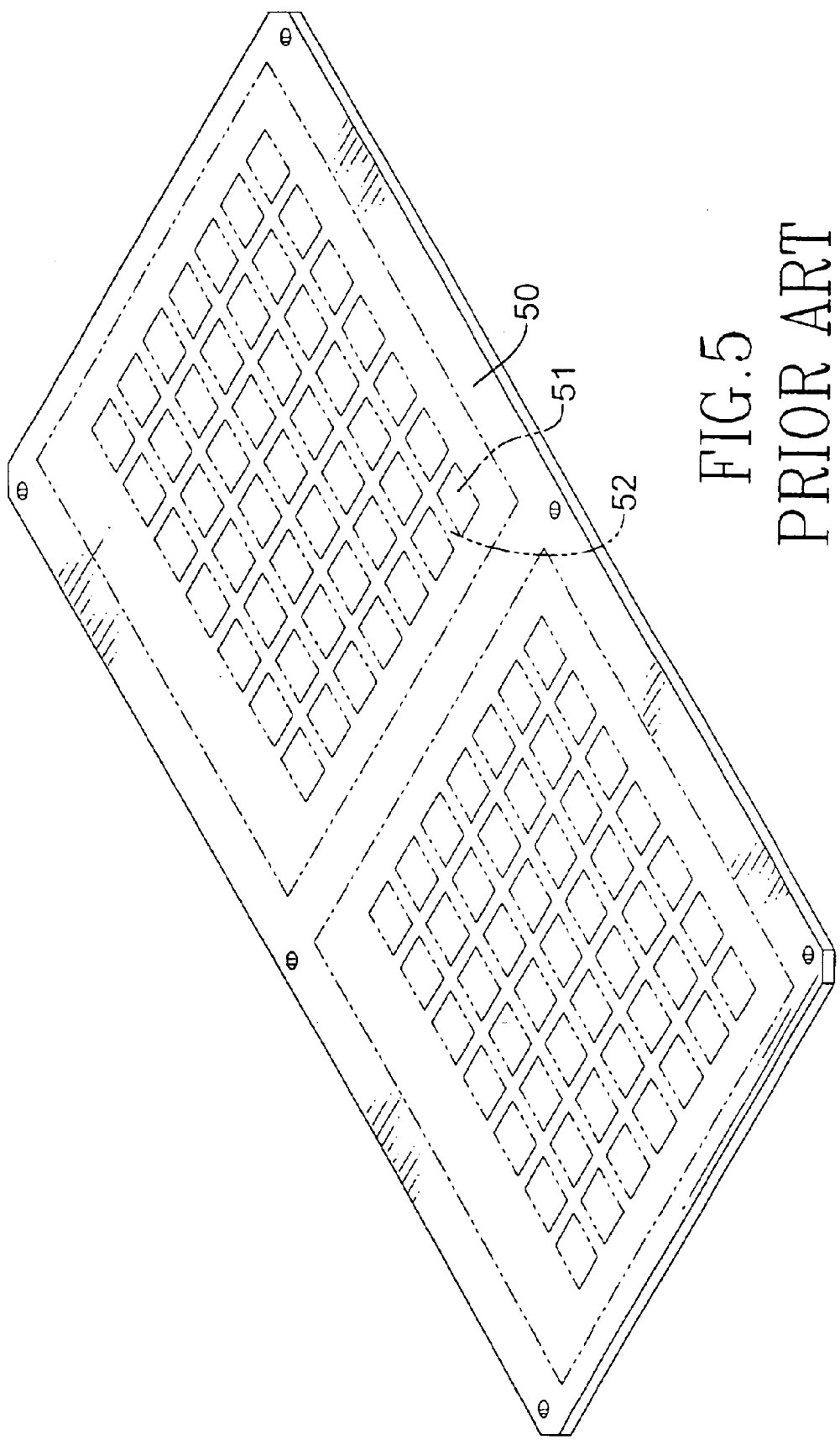
FIG. 5 is a perspective view of a conventional ceramic panel.
Figure 6A:
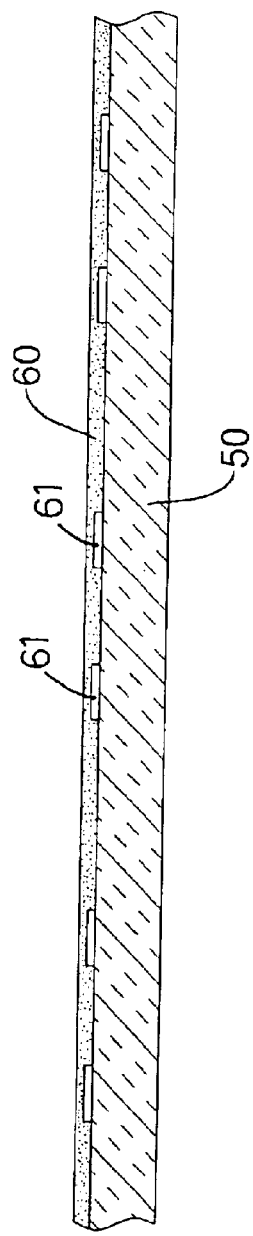
FIG. 6A is a side plan view in partial section of a packaged conventional ceramic panel.
Figure 6B:
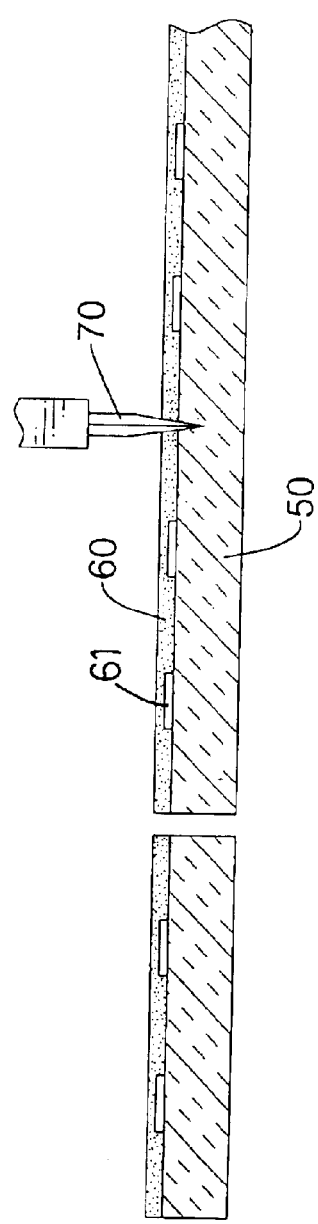
FIG. 6B is an operational side plan view in partial section of the packaged conventional ceramic panel in FIG. 6A being cut.

(10) in the frame (20) of a package carrier. In this embodiment, two chips (31) are mounted on each ceramic substrate (10). With reference to FIG. 4B, encapsulant (30) is applied to the package carrier after the chips (31) are mounted on the ceramic substrates (10). With reference to FIG. 4C, the polymide tape (21) is stripped from the bottom of the frame (20) after the encapsulant (30) solidifies. With reference to FIG. 4D, the package carrier with chips (31) and encapsulant (30) is cut along the cutting channels (25) to separate the individual electronic devices. Because the frame (20) of the package carrier is made of plastic, the packaged package carrier can be cut faster and easier than cutting a ceramic substrate.

The present invention provides a package carrier for a chip package process. The package carrier holds the ceramic substrates that are composed of multiple small ceramic plates. Therefore, the quality of the ceramic substrates is better than ceramic substrates cut out of large ceramic plates the present invention does not waste ceramic material during the cutting process because the package carrier uses multiple individual ceramic substrates. Furthermore, the present invention uses less time to cut out the individual packaged substrates, which increases the quantity of electronic devices fabricated.

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A package carrier comprising multiple ceramic substrates where each ceramic substrate is composed of multiple small low-temperature co-fired ceramics (LTCC) ceramic plates with wire patterns; and a frame having a bottom, at least one side, multiple through holes, multiple cutting channels defined between two of the through holes, at least one reference hole defined on the at least one side and a polyimide tape attached to the bottom to make the through holes become recess to hold the ceramic substrates, wherein the polymide tape has a high temperature-resistance.

2. The package carrier as claimed in claim 1, wherein the frame is made of plastic material.

3. The package carrier as claimed in claim 1, wherein the ceramic substrates and through holes are rectangular, and the ceramic substrates are slightly smaller than the through holes.

4. The package carrier as claimed in claim 3, wherein each through hole has four corners in which four notches are respectively defined.

\* \* \* \* \*